United States Patent
Kerr (12)

(10) Patent No.: US 6,232,602 B1
(45) Date of Patent: May 15, 2001

(54) ENHANCED VISION SYSTEM SENSITIVE TO INFRARED RADIATION

(75) Inventor: James Richard Kerr, Tigard, OR (US)

(73) Assignee: FLIR Systems, Inc., Portland, OR (US)

( * ) Notice: Subject to any disclaimer, the term of this patent is extended or adjusted under 35 U.S.C. 154(b) by 0 days.

(21) Appl. No.: 09/263,598

(22) Filed: Mar. 5, 1999

(51) Int. Cl.⁷ .................................. H01L 31/00
(52) U.S. Cl. .................. 250/330; 348/113; 348/115
(58) Field of Search ................ 250/330; 348/33, 348/113, 115, 116, 164

(56) References Cited

U.S. PATENT DOCUMENTS

| | | |
|---|---|---|
| 3,665,198 | 5/1972 | Barstad . |
| 4,086,616 * | 4/1978 | Catano et al. ................ 358/113 |
| 4,862,164 | 8/1989 | Croley et al. . |
| 5,140,416 * | 8/1992 | Tinkler ...................... 358/88 |
| 5,161,107 | 11/1992 | Mayeaux et al. . |
| 5,440,139 | 8/1995 | Smith . |
| 5,534,694 | 7/1996 | Ball et al. ................... 250/330 |
| 5,654,890 | 8/1997 | Nicosia et al. . |
| 5,698,852 | 12/1997 | Tanaka et al. ............... 250/332 |
| 5,699,278 | 12/1997 | Brajovic ..................... 382/308 |
| 5,719,567 | 2/1998 | Norris ........................ 250/372 |
| 5,808,350 | 9/1998 | Jack et al. ................... 257/440 |
| 5,811,807 | 9/1998 | Augeri et al. ................ 250/330 |
| 5,811,815 | 9/1998 | Marshall et al. ............ 250/370.06 |
| 5,818,052 | 10/1998 | Elabd ........................ 250/370.09 |
| 5,836,872 | 11/1998 | Kenet et al. ................. 600/306 |
| 6,009,340 * | 12/1999 | Hsia .......................... 358/113 |

OTHER PUBLICATIONS

Michael Johnson and Clark Rogers, "Photo–realistic scene presentation: virtual video camera", *SPIE*, vol. 2220, pp. 294–302, Mar. 1994.

David C. Burnham et al., United States Experience Using Forward Scattermeters for Runway Visual Range, U.S. Department of Transportation, Federal Aviation Administration, Document No. DOT/FAA/AND–97/1; DOT–VNTSC––FAA–97–1, Mar. 1997.

FLIR Systems, Inc.—Resource Center / Theory of Thermography, FSI internet page, Jan. 11, 1999, 7 pp.

FLIR Systems, Inc.—FSI Corporation Information / Media Room, FSI internet page, Jan. 11, 1999, 1 p.

Matrox Imaging Products—Matrox Genesis, internet page, Mar. 4, 1999, 17 pp.

* cited by examiner

*Primary Examiner*—F. L. Evans
(74) *Attorney, Agent, or Firm*—Kolisch, Hartwell, Dickinson, McCormack & Heuser

(57) ABSTRACT

An enhanced vision system and method for use with vision systems with an imager sensitive to infrared radiation of less than 2-microns in wavelength, to produce a first image signal. Another imager sensitive to infrared radiation at least 3-microns in wavelength may be used to produce a second image signal. Preferably, the first image signal represents sensed electric light sources, and the second image signal represents sensed background such as terrain, runways, structures, and obstacles. A signal processor combines an image signal representing locally maximum values of the first image signal with the second image signal to create a displayed image.

29 Claims, 4 Drawing Sheets

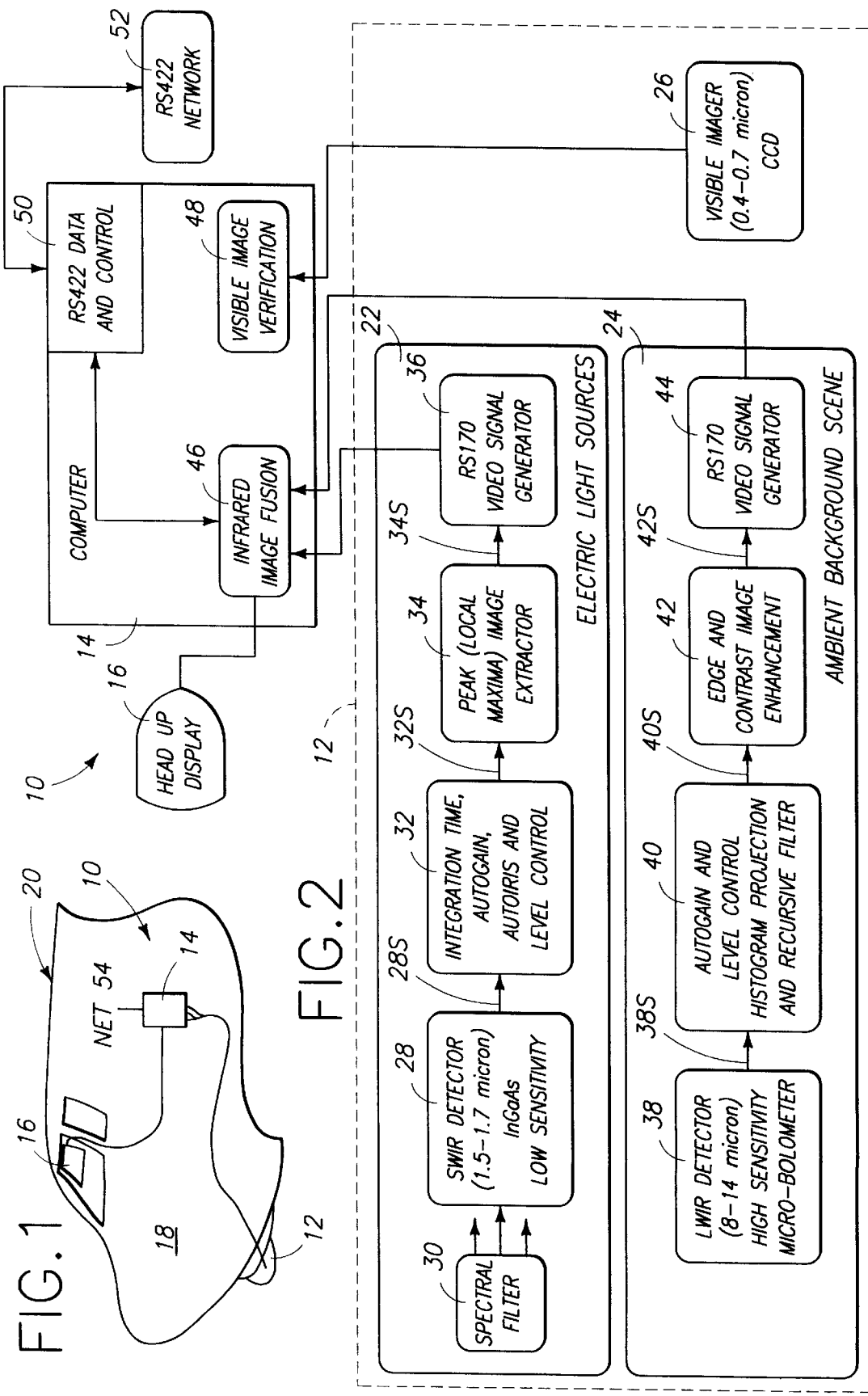

ENHANCED VISION SYSTEM SENSITIVE TO INFRARED RADIATION

BACKGROUND AND SUMMARY OF THE INVENTION

The present invention relates generally to machine vision systems and, ore specifically, to an enhanced vision system (EVS) for use in the piloting of aircraft. The invented system uses detectors sensitive to infrared radiation to generate a navigational display, preferably graphically representing the surrounding background scene such as terrain and structures, selected navigational references sensed by the EVS, and related information from other components of the overall navigation system for an aircraft. The preferred graphical representation is a fusion of enhanced, realistic camera images with computer-generated, scene-depicting symbology that is particularly helpful during approach and landing of an aircraft.

Vision systems are particularly valuable for the piloting of aircraft because aircraft are expected to fly in very diverse weather conditions, and because any error in navigating an aircraft can have extremely dire consequences. Poor visibility is often associated with flying in fog, but other atmospheric conditions severely limit visibility, including snow, rain, smoke, and ash. Discussion of the optical characteristics of the atmosphere and their impact on what is known as runway visual range is found in David C. Burnham et al., "United States Experience Using Forward Scattermeters for Runway Visual Range," U.S. Department of Transportation Report No. DOT/FAA/AND-97/1 DOT-VNTSC-FAA-97-1 (March, 1997), the disclosures of which are incorporated herein by reference. Furthermore, while the present invention is described with specific reference to EVS in aircraft, it is envisioned that the systems of the invention may be applied to other applications, including the use of machine vision in automobiles, as described in U.S. Pat. No. 5,161,107, the disclosures of which are incorporated herein by reference.

Various vision systems are disclosed in U.S. Pat. Nos. 4,862,164, 5,534,694, 5,654,890, 5,719,567, and in (1) Le Guilloux and Fondeur, "Using image sensors for navigation and guidance of aerial vehicles," *International Society for Optical Engineering (SPIE) Proceedings*, Vol. 2220, pp. 157–168; (2) Roberts and Symosek, "Image processing for flight crew enhanced situation awareness," *International Society for Optical Engineering (SPIE) Proceedings*, Vol. 2220 pp. 246–255; (3) Johnson and Rogers, "Photo-realistic scene presentation: 'virtual video camera'," *International Society for Optical Engineering (SPIE) Proceedings*, Vol. 2220, pp. 294–302; (4) Dickmanns et al., "Experimental Results in Autonomous Landing Approaches by Dynamic Machine Vision," *International Society for Optical Engineering (SPIE) Proceedings*, Vol. 2220, pp. 304–313; and (5) Mostafavi, "Landing trajectory measurement using onboard video sensor and runway landmarks," *International Society for Optical Engineering (SPIE) Proceedings*, Vol. 2463, pp. 116–127, the disclosures of which are incorporated herein by reference. Specific detectors for use in EVS are found in U.S. Pat. Nos. 5,808,350, 5,811,807, 5,811,815, and 5,818,052, the disclosures of which also are incorporated herein by reference.

The generated imagery of the present EVS may be displayed on a head-up display, but head-down or other displays are within the scope of this invention. Head-up displays typically are used for pilot control of an aircraft during landing, and head-down displays typically are used for pilot monitoring of automatic landing system performance.

The vision system of the present invention preferably generates a display based on a fusion of images from two imagers. One of the imagers senses short-wavelength infrared radiation (SWIR), and the other senses long- or medium-wavelength infrared radiation (LWIR or MWIR). Each imager includes a detector and electronics to process a signal produced by the detector. The imagers may share optics, or may each have separate optics. The imagers are described as separate items because this is believed the best way to implement the invention using current detector and optics components. However, the imagers or selected components of the imagers may be integrated into a single optics/detector/electronics devices in the future. For example, several of the incorporated patents disclose integrated detector devices, sensitive to two separate ranges of radiation.

By processing two ranges of IR wavelengths separately, a broad dynamic range may be allocated to the signal generated by each of the detectors, without concern for the dynamic range required by the other of the detectors. Signal conditioning and processing by each imager may be optimized for sensing and imaging details of particular radiation sources within a range of IR wavelengths. The conditioned and processed signals from the two imagers then are adjusted relative to each other so that the image of he radiation sources within both sensed ranges of IR wavelength may be fused without losing image detail of either of the imaged ranges of IR wavelengths.

An SWIR imager generates an image of electric light sources. The preferred detector has limited sensitivity to IR radiation wavelengths above approximately 1.7-microns. Electric navigation lights emit strongly within the 1.5-micron to 1.7-micron ange of wavelengths, and there is relatively little unwanted background solar radiation within this range. Accuracy is improved by spectrally filtering any radiation sensed by the SWIR detector using a filter having a cut-on wavelength of approximately 1.5-microns. Because of this, a sharp, well-defined image of navigation lights may be generated, even in bright daylight fog or other obscurant.

The sensitivity of the SWIR imager may be increased during non-daylight use by lowering the cut-on wavelength of the filter to approximately 1-micron to allow a broader spectrum of radiation to its detector. For current uncooled radiation detectors, sensitivity below 1-micron wavelengths is limited, so there is no need for a spectral filter at night. Furthermore, as uncooled radiation detectors are improved, it may be desirable to decrease the non-daylight cut-on wavelength to approximately 0.4-microns.

Similarly, future uncooled detectors sensitive to SWIR radiation may be sensitive to wavelengths longer than 1.7-microns. It is believed that sensitivity of a detector to radiation wavelengths up to approximately 2.35-microns would enhance system performance. Sensitivity to longer wavelengths than 2.4-microns may require a filter having a daylight and non-daylight cut-off wavelength of approximately 2.4-microns to limit the amount of background radiation sensed by the detector.

The preferred SWIR imager further includes a signal processor that identifies the center of each perceived radiation source within its specific wavelength range. The relative location of each perceived radiation point source then is mapped to a display, so that a precise dot or series of dots is displayed. It is believed that such a mapped pinpoint display is more useful to a pilot in navigation than a simple direct display of the perceived radiation sources, because the radiation sources tend to be sensed as relatively diffused blots or blurs that are difficult to interpret visually.

Furthermore, the diffused blots or blurs may be large enough to block or washout other imagery that needs to be displayed, as discussed below.

A preferred second imager senses long wavelength infrared radiation in the range of 8- to 14-microns in wavelength, to generate an image of the surrounding background scene such as runway edges, runway markings, terrain, structures and vehicles. Long-wavelength infrared radiation in this range of wavelengths has been found to have excellent transmissivity through fog and some other atmospheric conditions, and represents the peak spectral thermal emission of the background scene in cool ambient conditions. However, it does not include much radiation emitted by most navigation lights, so navigation lights do not show up well in images generated by the LWIR imager. A benefit is that navigation lights do not cause blooming or other interference in the images generated, or require any substantial portion of the dynamic range. Alternatively, the second imager can sense medium wavelength infrared radiation, in the range of 3- to 5-microns in wavelength, but this radiation tends to have less transmissivity through fog and other obscurants.

As described below, the image generated by the SWIR imager is relatively simple, with only a pattern of dots displayed. It is believed that this image may be displayed on a head-up display without undue distraction of a pilot, even in good visibility conditions. The background scene image generated by the LWIRJMWIR imager, on the other hand, may be distracting when good visibility conditions allow a pilot to see the relevant background scene without enhanced vision. Accordingly, the EVS of the present invention also may include a CCD visible light imager that monitors visibility conditions, and modifies image generation to minimize pilot distraction.

Further improvements to the images generated by the present EVS include enhancing the image based on pre-defined databases of patterns and features expected to be imaged. Object recognition may be used to identify recognizable patterns or features, and a computer-generated image may be fitted to the sensed image to add missing details. For example, varying atmospheric conditions may allow the EVS to sense only a portion of the radiation sources, or only sense them intermittently. Object recognition and computer-generated imagery is then used to fill in the missing details. Object recognition may also be used to improve navigational accuracy, by calculating a real-world position based on the location of identified patterns and features.

The advantages of the present invention will be understood more readily after a consideration of the drawings and the Detailed Description of the Preferred Embodiment.

BRIEF DESCRIPTION OF THE DRAWINGS

FIG. 1 is a simplified drawing showing a sensor head, auxiliary electronics and a display unit mounted in an airplane.

FIG. 2 is a block diagram of the sensor head, auxiliary electronics and display unit shown in FIG. 1.

DETAILED DESCRIPTION OF THE PREFERRED EMBODIMENT

Figure 4A:
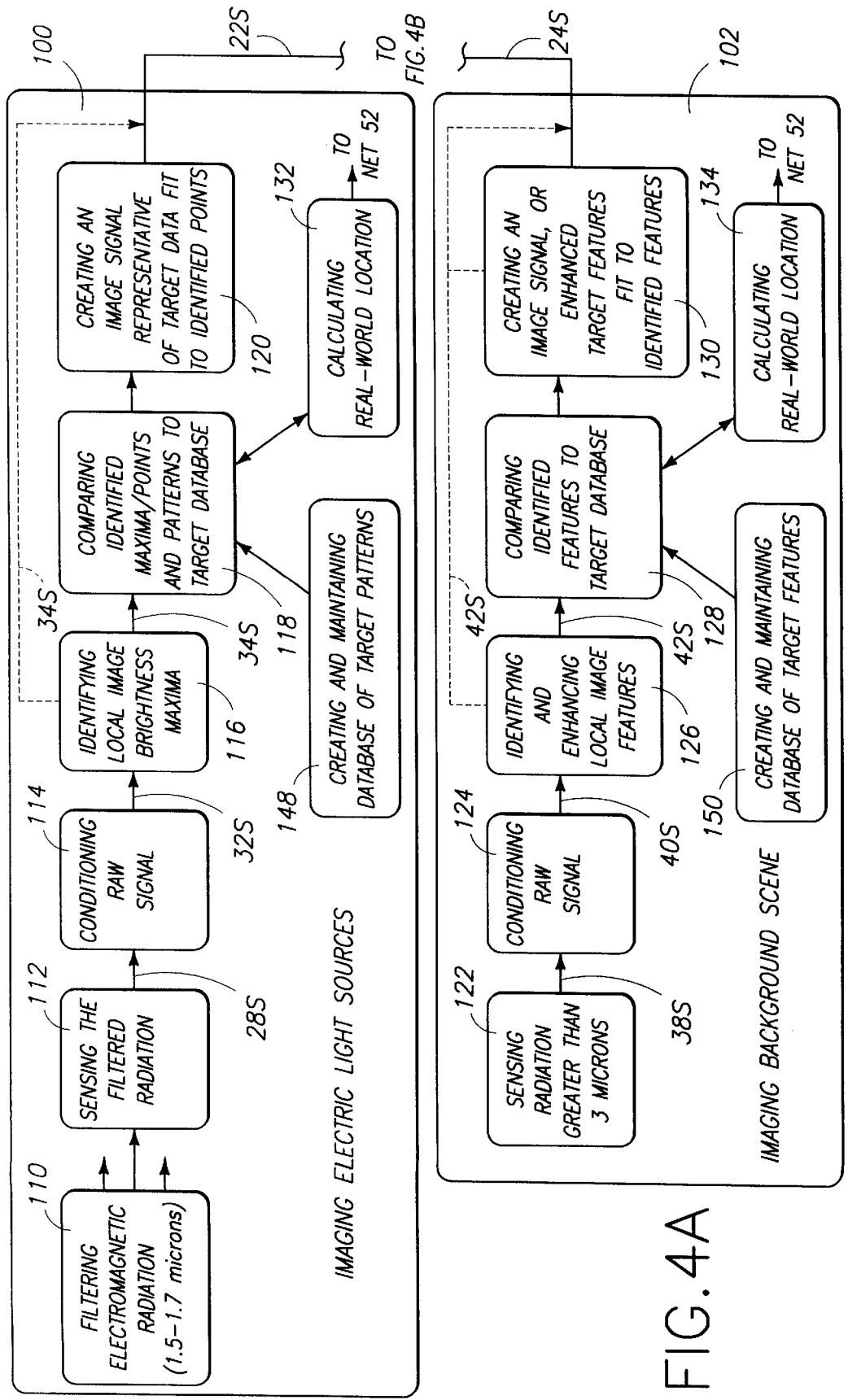
FIGS. 4A and 4B are a flowchart illustrating a method of the invention.

Referring to FIG. 1, an enhanced vision system (EVS) 10 is shown, including a multi-detector head 12, a computer 14, and a display 16, all of which generally are mounted in a forward section 18 of an aircraft 20. As shown in FIG. 2, multi-detector head 12 preferably includes an electric light source imager 22 for sensing infrared radiation from electric light sources, an ambient background scene imager 24 for sensing infrared radiation from a background scene, and a visible light imager 26 for sensing visible light to verify whether a human pilot should be able to view the background scene without the need for enhanced vision. Electric light source imager 22 and ambient background scene imager 24 both produce an RS170 video signal that is monitored by computer 14, and used to produce an image on head-up display 16. Visible light imager 26 is monitored by computer 14 separately from the video signals produced by video imagers 22 and 24, and is used to select whether to display either or both of the video signals generated by imagers 22 and 24, depending on the amount of contrast perceived by visible light imager 26.

Electric light source imager 22 senses electromagnetic radiation with an SWIR detector 28, preferably an uncooled InGaAs low sensitivity radiation detector, at least sensitive to electromagnetic radiation having wavelengths in the range of 1.5-microns to 1.7-microns. For example, the focal plane array detector incorporated in Model SU320-1.7RT-D "Indium Gallium Arsenide Near Infrared Camera" from Sensors Unlimited, Inc. in Princeton, N.J., is believed to be suitable. The Sensors Unlimited camera may be modified to make it flight-worthy, and to add hardware and software for the various control and conditioning steps referred to below. Another uncooled detector that may work well is an HgCtTe detector.

The radiation sensed by SWIR detector 28 is limited by a spectral filter assembly 30, described in more detail below, to optimize the sensitivity of electric light source imager 22 to electric light sources. For example, filter assembly 30 may be used to limit the transmission of infrared radiation to SWIR detector 28 to only that radiation having wavelengths of greater than approximately 1.5-microns. Day-light transmissivity of filter assembly 30 is minimal for radiation wavelengths of less than approximately 1.5-microns, which is known as the "cut-on" wavelength of filter assembly 30. This minimizes the amount of background solar radiation sensed by SWIR detector 28.

During non-daylight operations, when background solar radiation is negligible, filter assembly 30 may allow a broader range of infrared radiation to be sensed by SWIR detector 28, ideally ranging from 0.4-microns to 2.35-microns in wavelength. However, current detector technology does not require any filtering because the detectors are not sensitive to wavelengths of less than 1-micron. Accordingly, filter assembly 30 may simply remove the spectral filtration from the optical pathway of radiation incident on detector 28 during non-daylight operation.

Standard signal conditioning may be applied to the electronic signal 28S generated by SWIR detector 28 to optimize the dynamic range of the electronic signal as a function of the range of electromagnetic radiation sensed. This may include adjusting integration time for the signal, and applying autogain control, autoiris control, and level control, as indicated generally at 32. Various types of signal conditioning are described in the incorporated references.

The conditioned signal 32S then is processed to extract peaks or local maxima from the signal, as indicated by peak (local maxima) image extractor 34. Each peak or local maxima should represent an electric light source within the field of view of electric light source imager 22. The extracted maxima signal 34S produced by peak image extractor 34 then is used by an RS170 video signal generator 36 to generate a video signal 22S in which each peak is represented by a dot of predefined size. The predefined sizes for the dots may be a function of signal intensity, spacing between peaks, and other factors, to optimize the ability of a human viewing an image produced by EVS 10 to interpret the pattern produced.

Ambient background scene imager 24 preferably includes an LWIR detector 38. Detector 38 may be a high-sensitivity microbolometer array 38, sensitive to infrared radiation having wavelengths in the range of 8-microns to 14-microns. One LWIR detector that is believed to work well is a Boeing Model U3000A microbolometer detector.

Competitive technology to a microbolometer array includes a ferroelectric array. As discussed in the background section, above, detector 38 might also be an MWIR detector, sensitive to infrared radiation having wavelengths in the range of 3-microns to 5-microns. However, an LWIR detector is preferred, because it provides better imagery of cool background scenes, and better penetration of fog or other obscurants.

Standard signal conditioning is performed on LWIR signal 38S, including autogain and level control, histogram projection and recursive filtering, as indicated generally at 40. Preferably, the conditioned signal 40S then is subject to edge and contrast image enhancement, as indicated at 42. Such image enhancement is discussed in the incorporated references. An output signal 24S for imager 24 is generated by an RS170 video signal generator 44, which processes enhanced signal 42S.

Visible light imager 26 incorporates relatively standard visible light technology, including a CCD sensor, typically sensitive to radiation having wavelengths in the range of 0.4-microns to 0.7-microns. Various filtering, image conditioning and processing may be performed on the visible light signal generated by the CCD sensor, as desired. An output signal 26S from visible light imager 26 is directed to computer 14 for additional processing.

As shown in FIG. 2, computer 14 performs three general functions. First, computer 14 combines video signals 22S and 24S generated by electric light source imager 22 and ambient background scene imager 24, as represented by infrared image fusion 46. Second, computer 14 controls image fusion 46 based on optional visible light imager 26, through visible image verification as indicated generally at 48. Third, computer 14 communicates data and control with other systems of aircraft 20, as indicated at 50 and 52. For much of the image processing, the Matrox Genesis vision processor hardware manufactured by Matrox Electronics Systems, Ltd., Doral, Quebec, Canada, may be used as part of computer 14.

Computer 14 monitors the signal produced by visible light imager 26 to determine if there is sufficient contrast within the image perceived by visible light imager 26. A relatively high contrast within the image represented by signal 26S indicates that a human viewing the same scene with the naked eye should be able to perceive details of the ambient background scene. Accordingly, computer 14 may be programmed to remove the video signal 24S (ambient background scene imager 24) from the fused image that is displayed on display 16. This simplifies the image substantially, while continuing to provide a pilot with computer-generated images of electric light sources.

Computer 14 coordinates EVS 10 with other devices and systems of aircraft 20. For example, it may be desirable to control display 16 from other devices, or to add information to the image generated on display 16, as represented by an RS422 data and control device 50 that communicates with an RS422 network 52. The transmission of data and control between computer 14 and network 52 may be bidirectional, with any of the video signals or real-world position information generated by imagers 22, 24, and 26 transmitted to other systems via network 52, and override control exercised by other systems via network 52.

Figure 3:
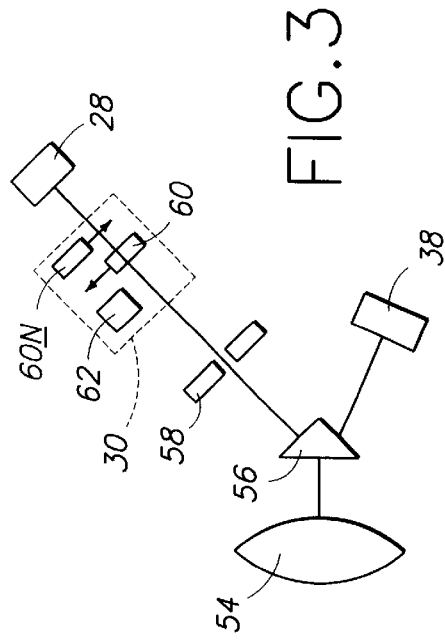
FIG. 3 is a block diagram of the optical portion of the infrared imagers of the present invention.

Turning now to FIG. 3, a combined optical portion of electric light source imager 22 and ambient background scene imager 24 is shown in more detail. This includes an optical lens 54, a dichroic beam splitter 56, and a controllable iris 58. Filter assembly 30 and iris 58 are interposed between beam splitter 56 and SWIR detector 28. A more economical optical system, using current technology, is to provide a separate lens and optical path for each imager 22, 24, and then align imagers 22 and 24 so that they are mutually boresighted.

The preferred embodiment of filter assembly 30 includes a filter 60 intended for use during daylight operations. Filter 60 limits the passage to detector 28 of infrared radiation having a wavelength of less than approximately 1.5-microns. A filter allowing a lower range of wavelengths to pass may be used as well, but it is believed that a filter having a cut-on wavelength of less than 1.5-microns will admit too much solar background radiation for effective sensing during daylight operations. Filter 60 may also limit the passage to detector 28 of infrared radiation having a wavelength of greater than approximately 1.7-microns (or 2.4-microns), for the reasons discussed above.

Filter assembly 30 optionally may include a nighttime filter 60N for use during non-daylight operation. Nighttime filter 60N may have a cut-on wavelength of approximately 1-micron, and may have a cut-off wavelength of approximately 1.7-microns, or a broader range of 0.4-microns to 2.4-microns, in part depending on the sensitivity of detector 28. In the embodiment of FIG. 3, a filter control assembly 62 may be used to control which of the filters, if any, is interposed between lens 54 and SWIR detector 28. This control may be based on any of the radiation sensed by imagers 22, 24, or 26, or based on other sensors or pilot control, as desired. Various alternative embodiments to filter assembly 30 may develop as filter technology improves.

Figure 4B:
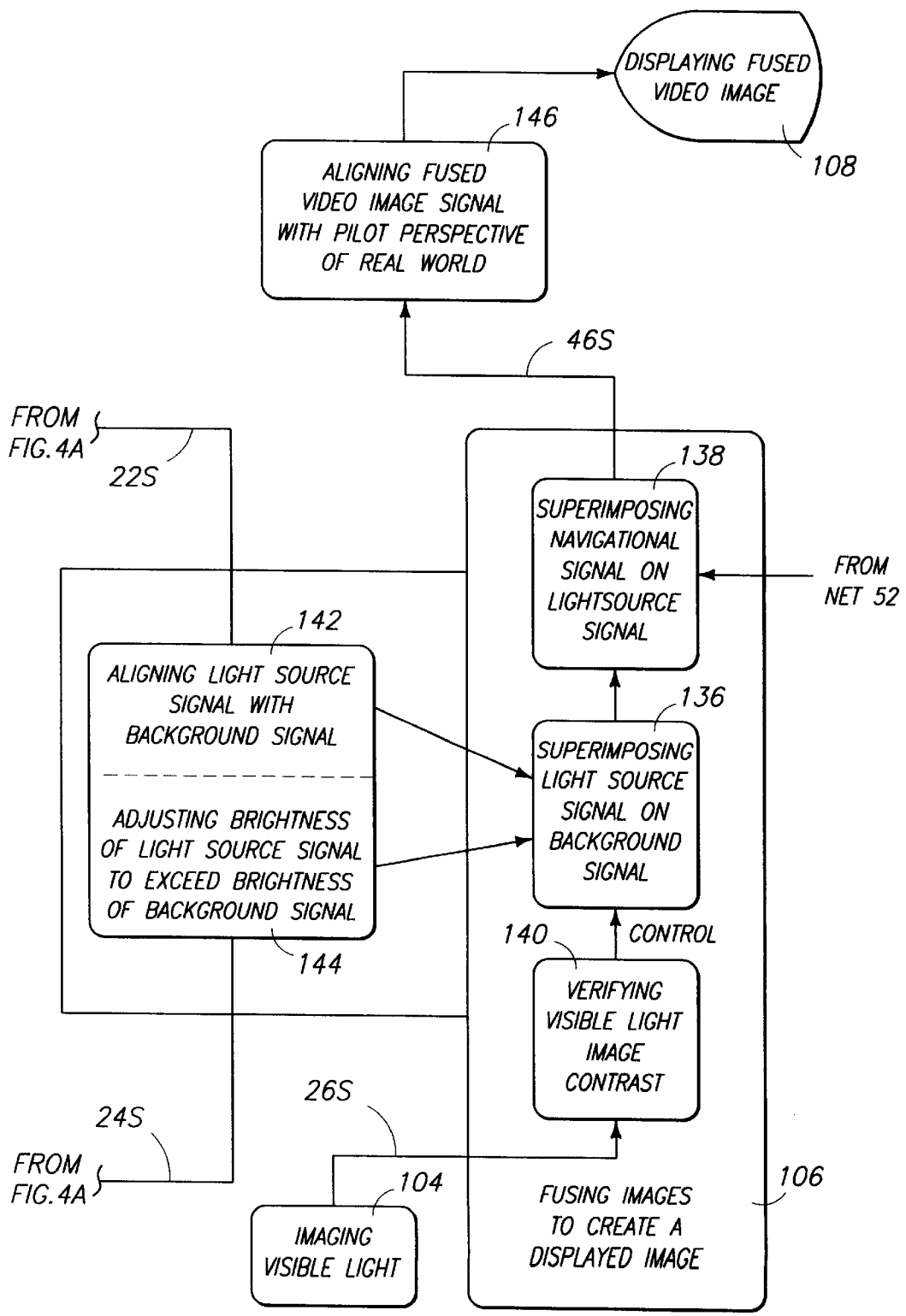

Turning now to FIGS. 4A and 4B, collectively, a method of the present invention is represented in a flowchart. Some of the results of the described steps are related to the above discussion by referring to the components or signals labeled in FIG. 2. However, it is to be understood that the method may be accomplished using various hardware and software configurations, with different signal processing, so the identification of components and signals is for illustrative purposes only, and is not to limit the scope of the invention.

The preferred method includes imaging electric light sources, at 100, imaging an ambient background scene, at 102, and imaging a visible light view, at 104. Image signals 22S (light source), 24S (background) and 26S (visible light) are produced by the imaging steps 100, 102, and 104, respectively, and then are processed by fusing light source image signal 22S with background image signal 24S, represented generally at 106, based on image signal 26S and control and data from other systems on aircraft 20. This is followed by displaying the fused image signal 46S, if desired, at 108.

Imaging electric light sources 100 may include filtering electromagnetic radiation, at 110, using spectral filter assembly 30, to limit the passage to SWIR detector 28 of infrared radiation. Imaging step 100 also may include sensing the filtered radiation with SWIR detector 28, at 112, and conditioning the signal 28S generated by SWIR detector 28, using autogain, autoiris, and level control 32, at 114, to create a conditioned sensed electric light source signal 32S. A graphic representation of a video image generated with conditioned electric light source signal 32S is shown in FIG. 5.

Figure 5:
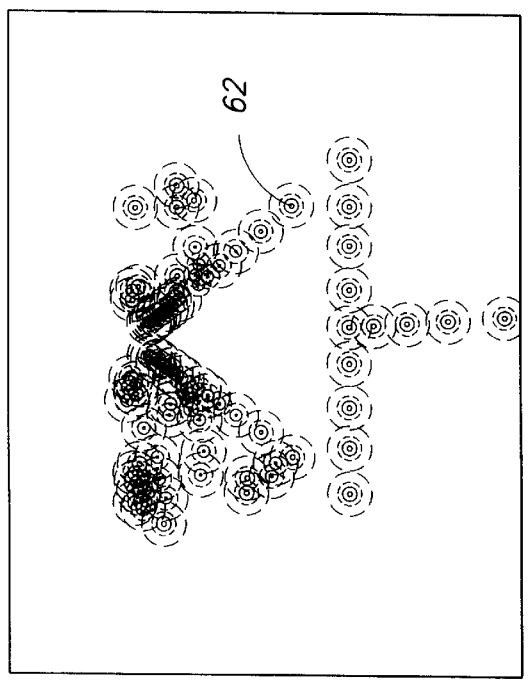
FIG. 5 is a representation of an image that would be generated with an unprocessed signal from the SWIR imager of the present invention.

Substantial atmospheric diffusion by fog between the source of the radiation sensed and EVS 10 would cause the resulting image to be relatively unintelligible to a human viewer, as shown by blurs 62 in FIG. 5. Conditioned signal 32S therefore requires additional processing, as shown in FIG. 4A, including identifying local image brightness maxima, at 116, resulting in identified maxima signal 34S. The identified maxima signal may be transmitted directly to the step of fusing imager signals, 106, or to other systems, as represented by dashed line 34S.

In some embodiments of the method, intelligent processing of identified maxima signal 34S includes comparing identified maxima to a target database to identify a recognizable pattern, at 118, and creating an artificial image signal representative of the recognizable pattern at 120. The artificial image signal is fitted to the identified maxima, so that a complete image pattern is displayable, even when the radiation sources are obscured, intermittently or partially. By coordinating the creation of the artificial image signal with navigational data indicating the location and movement of aircraft 20, a continuous, accurate representational image of electric light sources may be generated which then is processed according to fusing step 106.

Figure 6:
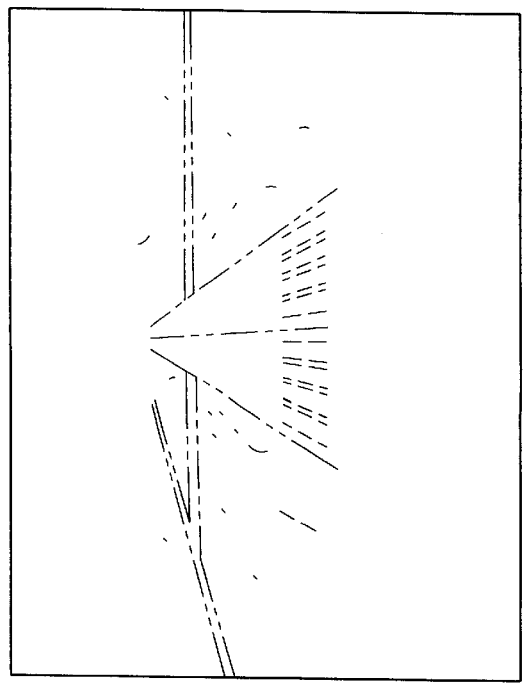
FIG. 6 is a representation of an image that would be generated with an unprocessed signal from the LWIR imager of the present invention.

Similar steps are peifoi-med as part of imaging background scene at 102. Sensing LWIR radiation, or MWIR radiation, is shown at 122, to produce a raw background image signal 38S, the display of which is represented in FIG. 6. Conditioning raw background image signal, at 124, is performed using conventional autogain control, recursive filters, and image enhancement, to create conditioned background image signal 40S.

As a further alternative, imaging step 102 may include identifying and enhancing local image features through edge definition procedures or other object identification procedures, at 126, to create signal 42S, and comparing the identified features to a database of target features to determine if the sensed features are recognizable, at 128. Creating an enhanced image signal, at 110, simply may be the mapping of signal 42S, including any defined edges, to an image signal. It may also involve adding computer-generated sharpening to highlight any defined edges. In even more advanced forms, it may involve calculating an image based on available navigational data and recognizable target features, and generating an image in proper perspective that is fit to the recognizable features in the sensed image to provide a more complete image than is sensed by sensor head 12. If desired, a completely synthetic, calculated image representing the background could be generated.

Furthermore, the results of comparing steps 118 and 128, related to recognizable patterns and features, may be used to calculate a real-world location of aircraft 20 to supplement the navigational data referred to above. This location data may be used by EVS 10, and by other systems of aircraft 20, as shown at steps 132 and 134.

Figure 7:
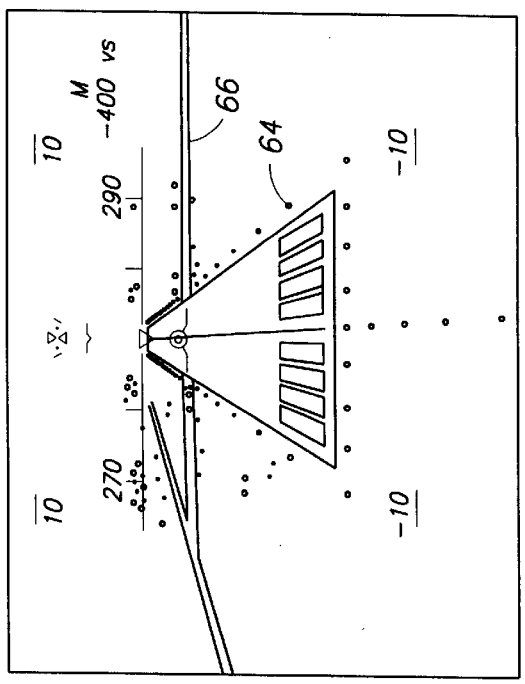
FIG. 7 is a representation of the processed, fused image produced on a display of the present invention.

Preferably, fusing step 106 shown in FIG. 4B, includes superimposing, at 136, the light source signal from light source imaging step 100, on the background signal from background imaging step 102, when there is insufficient contrast found in the signal from the step of imaging visible light, 104. This is followed by superimposing a navigational signal to show additional data helpful to piloting aircraft 20, such as HUD stroke guidance symbols and other symbology, at 138. Alternatively, when sufficient contrast is found in imaging visible light step 104, fusing step 106 includes only superimposing a navigational signal on the signal from imaging light sources step 100, at 138. Referring to FIG. 7, dots 64 and features 66 are shown, along with navigational data 68.

Atmospheric visibility for a human viewer is determined by verifing visible light image contrast, at 140. If there is sufficient contrast found in visible light imaging, then it is assumed that a pilot can observe the ambient background scene without the need for enhanced vision. By removing imaging of the background scene from the resulting display, but maintaining a computer-generated image of identified light sources, useful data may be provided, without unneeded clutter. When contrast in the visible light imaging is reduced, computer-generated images of the background scene automatically are displayed again, so that a pilot may see a continuous visual image, real or generated, of the runway and background terrain, regardless of intermittent fog or other obscurant.

To ensure usefulness of the image generated by EVS 10, the method further includes aligning, at 142, the signal generated by light source imaging 100 with the signal generated by background imaging 102, so that relevant portions of each image correspond to one another. Aligning step 142 may be accomplished simply by maintaining proper mechanical alignment between SWIR detector 28 and LWIR detector 38, particularly when a single lens 54 and a dicliroic beam splitter 56 are used in connection with detectors 28 and 38. Readability of the resulting image is improved, at 144, by adjusting brightness of signals 22S and 24S so that the displayed brightness generated by signal 22S is greater than the displayed brightness generated by any portion of signal 24S.

When the present method is used with a head-up display, the method may include aligning the displayed fused video image with pilot perspective of the real world, at 146, perceived through the windshield of aircraft 20. This may be accomplished either by moving head-up display relative to a pilot, or shifting the fused video image on head-up display 16, electronically.

The optional steps of comparing identified point-source patterns or features to a target database, at 118 and 128, require creating and maintaining a database of target patterns and features, as indicated in FIG. 4A at 148 and 150, respectively. The created databases should include information on the global location of the target patterns and features, so that relevant portions of the database may be identified based on GPS and other navigational information from other systems of aircraft 20.

While the invention has been disclosed in its preferred form, the specific embodiments thereof as disclosed and illustrated herein are not to be considered in a limiting sense as numerous variations are possible. Applicant regards the subject matter of the invention to include all novel and non-obvious combinations and subcombinations of the various elements, features, functions and/or properties disclosed herein. No single feature, function, element or property of the disclosed embodiments is essential. The following claims define certain combinations and subcombinations which are regarded as novel and non-obvious. Other combinations and subcombinations of features, functions, elements and/or properties may be claimed through amendment of the present claims or through presentation of new claims in this or a related application. Such claims, whether they are broader, narrower or equal in scope to the original claims, are also regarded as included within the subject matter of applicant's invention.

I claim:

1. A method of processing signals representative of a machine-sensed environment, comprising the steps of:
   sensing infrared radiation having wavelengths in the range of 1-microns to 2-microns to create a sensed electric light-source infrared signal;
   determining a relative location of at least one local maximum within the sensed electric light-source signal;
   sensing infrared radiation having wavelengths of at least 3-microns to produce a sensed background-scene signal; and
   producing an image signal by:
      assigning levels of brightness to the sensed background-scene signal, assigning levels of brightness to at least one of the local maximums of the sensed electric light-source infrared signal that are greater than the level of brightness assigned to the sensed background-scene signal within the relative location of the at least one of the local maximums, and
      mapping the assigned levels of brightness to a display.

2. The method according to claim 1, wherein the step of sensing to create a sensed electric light-source infrared signal includes the step of filtering radiation incident on a detector to limit the passage to the detector of infrared radiation.

3. The method according to claim 1, wherein the step of sensing to create a sensed electric light-source infrared signal includes the step of filtering radiation incident on a detector to limit the passage to the detector of infrared radiation having a wavelength of less than approximately 1-micron.

4. The method according to claim 1, wherein the step of sensing to create a sensed electric light-source infrared signal includes the step of filtering radiation incident on a detector to limit the passage to the detector of infrared radiation having a wavelength of less than approximately 1.5-microns.

5. The method according to claim 1, wherein the step of sensing to create a sensed electric light-source infrared signal includes the steps of:
   filtering radiation incident on a detector during daylight operation to limit the passage to the detector of infrared radiation having a wavelength of less than approximately 1.5-microns; and
   not filtering radiation incident on a detector during non-daylight operation.

6. The method according to claim 1, wherein the step of sensing to create a sensed electric light-source infrared signal includes the steps of:
   filtering radiation incident on a detector during daylight operation using a filter having a cut-on wavelength of approximately 1.5-microns; and
   removing the filter from the optical pathway of radiation incident on a detector during non-daylight operation.

7. The method according to claim 1, further comprising the step of identifying an object by determining if the relative location of the local maximum is within a certain range of a calculated location based on predefined data representative of expected local maximums.

8. The method according to claim 7, further comprising the steps of:
   determining the difference between the relative location of the local maximum and the calculated location; and
   calculating a geographical position of the detector based on the determined difference.

9. An enhanced vision system comprising:
   a detector at least sensitive to electromagnetic radiation having wavelengths in the range of 1.5-microns to 1.7-microns to create an image signal;
   a signal processor to determine the relative location of a local maximum in the image signal; and
   a display on which the relative location of the local maximum is represented graphically as a pre-defined dot.

10. The system of claim 9, further comprising a filter that limits the passage to the detector of infrared radiation having a wavelength of less than approximately 0.4-microns and that limits the passage to the detector of infrared radiation having a wavelength of greater than approximately 2.4-microns.

11. The system of claim 9, further comprising a filter that limits the passage to the detector of infrared radiation having a wavelength of less than 1.5-microns.

12. The system of claim 9, further comprising:
   a daylight filter that limits the passage to the detector of infrared radiation having a wavelength of less than 1.5-microns;
   a nighttime filter that limits the passage to the detector of infrared radiation having a wavelength of less than 0.4-micron; and
   a filter control that switches between the daylight and nighttime filters.

13. The system of claim 9, wherein the display is a head up display.

14. The system of claim 13, further comprising a visible light sensor and processor that determines when adequate visibility is available of a desired object, and that deactivates at least a portion of the display of the relative location of the local maximum when adequate visibility is available.

15. The system of claim 9, further comprising an object identifier that identifies an object when the relative location of the local maximum is within a certain range of a calculated location based on predefined data representative of expected local maximums.

16. The system of claim 15, further comprising a location calculator that determines the difference between the relative location of the local maximum and the calculated location, and that calculates a geographical position of the detector based on the determined difference.

17. The system of claim 9, further comprising a detector at least sensitive to electromagnetic radiation having wavelengths of at least 3-microns, to produce a background scene image signal that is represented graphically on the display.

18. The system of claim 17, wherein the detectors are part of an integrated device.

19. The system of claim 17, further comprising a visible light sensor and processor that determines when adequate human visibility is available of the background scene, and that deactivates at least a portion of the background image scene signal when adequate visibility is available.

20. An enhanced vision system comprising:
    a first infrared detector sensitive to infrared radiation of less than 2-microns in wavelength, to produce a first image signal;
    a filter that limits the passage to the first infrared detector of infrared radiation having a wavelength of less than approximately 1-micron;
    a second infrared detector sensitive to infrared radiation at least 3-microns in wavelength, to produce a second image signal; and
    a signal processor that combines an image signal representing locally maximum values of the first image signal with the second image signal to create a displayed image.

21. An enhanced vision system comprising:
    a first infrared detector sensitive to infrared radiation of less than 2-microns in wavelength, to produce a first image signal;
    a filter that limits the passage to the first infrared detector of infrared radiation having a wavelength of greater than approximately 1.7-microns;
    a second infrared detector sensitive to infrared radiation at least 3-microns in wavelength, to produce a second image signal; and
    a signal processor that combines an image signal representing locally maximum values of the first image signal with the second image signal to create a displayed image.

22. An enhanced vision system comprising:
    a first infrared detector sensitive to infrared radiation of less than 2-microns in wavelength, to produce a first image signal;
    a filter that limits the passage to the first infrared detector of infrared radiation having a wavelength of less than approximately 1-micron and that limits the passage to the first infrared detector of infrared radiation having a wavelength of greater than approximately 1.7-microns,
    a second infrared detector sensitive to infrared radiation at least 3-microns in wavelength, to produce a second image signal; and
    a signal processor that combines an image signal representing locally maximum values of the first image signal with the second image signal to create a displayed image.

23. An enhanced vision system comprising:
    a first infrared detector sensitive to infrared radiation of less than 2-microns in wavelength, to produce a first image signal;
    a filter that limits the passage to the first infrared detector of infrared radiation having a wavelength of less than 1.5-microns;
    a second infrared detector sensitive to infrared radiation at least 3-microns in wavelength, to produce a second image signal; and
    a signal processor that combines an image signal representing locally maximum values of the first image signal with the second image signal to create a displayed image.

24. An enhanced vision system comprising:
    a first infrared detector sensitive to infrared radiation of less than 2-microns in wavelength, to produce a first image signal;
    a filter that limits the passage to the first infrared detector of infrared radiation having a wavelength of less than 1.5-microns and that limits the passage to the first infrared detector of infrared radiation having a wavelength of greater than 1.7-microns;
    a second infrared detector sensitive to infrared radiation at least 3-microns in wavelength, to produce a second image signal; and
    a signal processor that combines an image signal representing locally maximum values of the first image signal with the second image signal to create a displayed image.

25. An enhanced vision system comprising:
    a first infrared detector sensitive to infrared radiation of less than 2-microns in wavelength, to produce a first image signal;
    a second infrared detector sensitive to infrared radiation at least 3-microns in wavelength, to produce a second image signal; and
    a signal processor that combines an image signal representing locally maximum values of the first image signal with the second image signal to create a displayed image;
    wherein the first infrared detector and the second infrared detector are part of an integrated device.

26. The system of claim 25, further comprising:
    a head up display on which the displayed image is displayed; and
    a visible light sensor and processor that determines when adequate visibility is available of a desired object, and that deactivates at least a portion of the displayed image when adequate visibility is available.

27. An enhanced vision system comprising:
    a first infrared detector sensitive to infrared radiation of less than 2-microns in wavelength, to produce a first image signal;
    a second infrared detector sensitive to infrared radiation at least 3-microns in wavelength, to produce a second image signal;
    a signal processor that combines an image signal representing locally maximum values of the first image signal with the second image signal to create a displayed image; and
    a visible light sensor and processor that determines when adequate visibility is available of a desired object, and that deactivates at least a portion of the displayed image when adequate visibility is available.

28. An enhanced vision system comprising:
    a first infrared detector sensitive to infrared radiation of less than 2-microns in wavelength, to produce a first image signal;
    a second infrared detector sensitive to infrared radiation at least 3-microns in wavelength, to produce a second image signal;
    a signal processor that combines an image signal representing locally maximum values of the first image signal with the second image signal to create a displayed image; and
    an object identifier that compares at least one of the image signals to predefined data representative of expected sensed objects, and that modifies the one of the image signals to match the predefined data when sufficient similarity is found between the one of the image signals and the predefined data.

29. An enhanced vision system comprising:

a first infrared detector sensitive to infrared radiation of less than 2-microns in wavelength, to produce a first image signal;

a second infrared detector sensitive to infrared radiation at least 3-microns in wavelength, to produce a second image signal;

a signal processor that combines an image signal representing locally maximum values of the first image signal with the second image signal to create a displayed image; and a location calculator that determines the difference between the relative location of an identified object within the image signal and a calculated location for the identified object based on predefined data, and that calculates a geographical position of the detector based on the determined difference.

* * * * *